(12) United States Patent
Bang

(10) Patent No.: US 7,944,014 B2
(45) Date of Patent: May 17, 2011

(54) IMAGE SENSOR

(75) Inventor: Sun-Kyung Bang, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/578,159

(22) Filed: Oct. 13, 2009

(65) Prior Publication Data
US 2010/0024979 A1   Feb. 4, 2010

Related U.S. Application Data

(62) Division of application No. 11/850,291, filed on Sep. 5, 2007, now Pat. No. 7,618,834.

(30) Foreign Application Priority Data

Sep. 12, 2006   (KR) .................. 10-2006-0087752

(51) Int. Cl.
*H01L 31/0232*   (2006.01)
(52) U.S. Cl. ........... 257/432; 257/94; 257/103; 438/16; 438/29
(58) Field of Classification Search .............. 257/94, 257/103, 431, 432; 438/16, 28, 29, 34, 35
See application file for complete search history.

(56) References Cited

U.S. PATENT DOCUMENTS

| 6,852,565 | B1 | 2/2005 | Zhao | |
|---|---|---|---|---|
| 7,098,115 | B2 * | 8/2006 | Tanaka et al. | 438/424 |
| 7,569,422 | B2 * | 8/2009 | Lin | 438/113 |
| 2003/0197178 | A1 * | 10/2003 | Yamazaki et al. | 257/59 |
| 2007/0158772 | A1 * | 7/2007 | Boettiger | 257/432 |

FOREIGN PATENT DOCUMENTS

KR   1020060091343 A   8/2006

\* cited by examiner

*Primary Examiner* — Phuc T Dang
(74) *Attorney, Agent, or Firm* — Sherr & Vaughn, PLLC

(57) ABSTRACT

Embodiments relate to a method of manufacturing an image sensor which includes forming a plurality of lower layers over a semiconductor substrate. A first passivation layer may be formed over the lower layers to protect the lower layers. The first passivation layer may be formed in a pixel region and a peripheral region with different thicknesses. A spin-on-glass (SOG) layer may be formed over the first passivation layer. A second passivation layer may be formed over the SOG layer. Array etching may be used to form a concave area in the semiconductor substrate. A plurality of micro lenses may be formed over the bottom surface of the concave area.

9 Claims, 4 Drawing Sheets

IMAGE SENSOR

Figure 1:
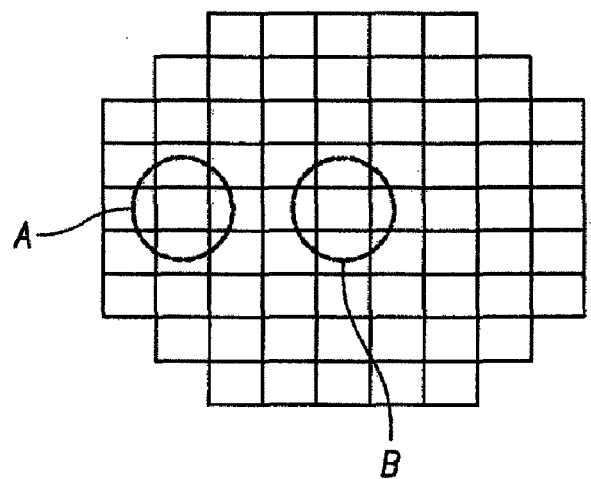

This application is a Divisional Application of a co-pending U.S. patent application Ser. No. 11/850,291 filed on Sep. 5, 2007, now U.S. Pat. No. 7,618,834, which claims priority under 35 U.S.C. 119 to Korean Patent Application No. 10-2006-0087752, filed Sep. 12, 2006, which are both hereby incorporated by reference in their entirety.

BACKGROUND

An image sensor converts an optical image into an electrical signal. Image sensors may be largely classified into complementary metal-oxide-silicon (CMOS) image sensors and charge coupled device (CCD) image sensors. A CCD image sensor may generally have better noise and photosensitivity characteristics compared with the CMOS image sensor. However, the CCD image sensor may be difficult in relatively high integration environments, and has relatively higher power consumption. The CMOS image sensor has a simpler manufacturing process, relatively higher integration, and lower power consumption, compared with the CCD image sensor. As technology for manufacturing semiconductor devices has developed, technology for manufacturing the CMOS image sensor and resultant characteristics thereof are greatly improved. Research into the CMOS image sensor continues.

In general, a pixel of a CMOS image sensor includes photodiodes for receiving light and CMOS elements for controlling image signals input through the photodiodes. The photodiodes generate electron-hole pairs according to the wavelengths and the intensities of red light, green light and blue light input through color filters. An output signal varies depending on the amount of generated electrons. Accordingly, an image can be sensed electronically.

A CMOS image sensor includes a pixel region for performing photoelectric conversion, and a peripheral circuit region for detecting signals converted in the pixel region. The peripheral circuit region surrounds the pixel region. In a CMOS image sensor, photoresist is coated over a semiconductor device to form a micro lens. The slope of the bottom surface of the semiconductor substrate should be minimized to achieve planarization such that the photoresist is evenly coated over the entire surface of the semiconductor device.

In the related art, an over chemical-mechanical polishing (over CMP) process may be performed in the pixel region so that the undoped silicate glass (USG) is thinner than that in the peripheral region. As shown in example FIG. 1, after array etching, a difference in thickness between a center B and an edge A of the semiconductor substrate occurs. This difference in topology adds to the difficulty in adjusting the thickness and the radius of curvature of the micro lens during micro lens fabrication. These problems have an influence on the manufacturing process and the quality of the image produced by the sensors.

SUMMARY

Embodiments relate to an image sensor, and more particularly, to a method of manufacturing an image sensor. Embodiments relate to a method of manufacturing an image sensor capable of planarizing topologies of a pixel region and a peripheral region. Embodiments relate to a method of forming the micro lens allowing for adjustment of a thickness and a radius of curvature of the micro lens.

Embodiments relate to a method of manufacturing an image sensor which includes forming a plurality of lower layers over a semiconductor substrate. A first passivation layer may be formed over the lower layers to protect the lower layers. The first passivation layer may be formed in a pixel region and a peripheral region with different thicknesses. A spin-on-glass (SOG) layer may be formed over the first passivation layer. A second passivation layer may be formed over the SOG layer. Array etching may be used to form a concave area in the semiconductor substrate. A plurality of micro lenses may be formed over the bottom surface of the concave area.

Forming of the lower layers may include forming a silicon epi layer including color diodes over the semiconductor substrate. A dielectric layer may be formed of silicon nitride. A metal insulator metal (MIM) layer, and first and second inter-metal dielectric (IMD) layers may be formed over the silicon epi layer. The first IMD layer may be formed of a silicon oxide, and the second IMD layer may be formed of undoped silicate glass (USG) or tetra ethyl ortho silicate (TEOS).

The first passivation layer may be formed of USG. The second passivation layer may be formed of silicon nitride. The method may further include forming a silicon nitride over the semiconductor substrate including the concave area, before forming the plurality of micro lenses.

The forming of the SOG layer may include forming the SOG layer over the first passivation layer. The SOG layer may be annealed to cure the SOG layer. A chemical mechanical polishing (CMP) process may be performed with respect to the SOG layer.

DRAWINGS

FIG. 1 is a view showing a difference in topology between a center and an edge of a semiconductor substrate on which a plurality of image sensors are formed.

Example FIGS. 2A to 2F are cross-sectional views illustrating a method of manufacturing an image sensor according to embodiments.

DESCRIPTION

Example FIGS. 2A to 2F are cross-sectional views illustrating a method of manufacturing an image sensor according to embodiments. In particular, an image sensor according to embodiments may be a vertical type image sensor. In embodiments, a structure for removing a topology of a pixel array portion may be formed using the following manufacturing method.

Figure 2A:
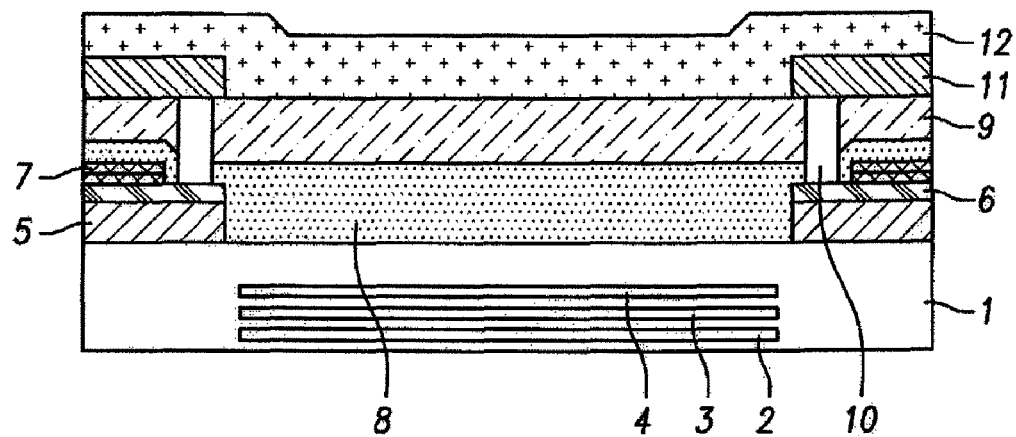
Figure 2B:
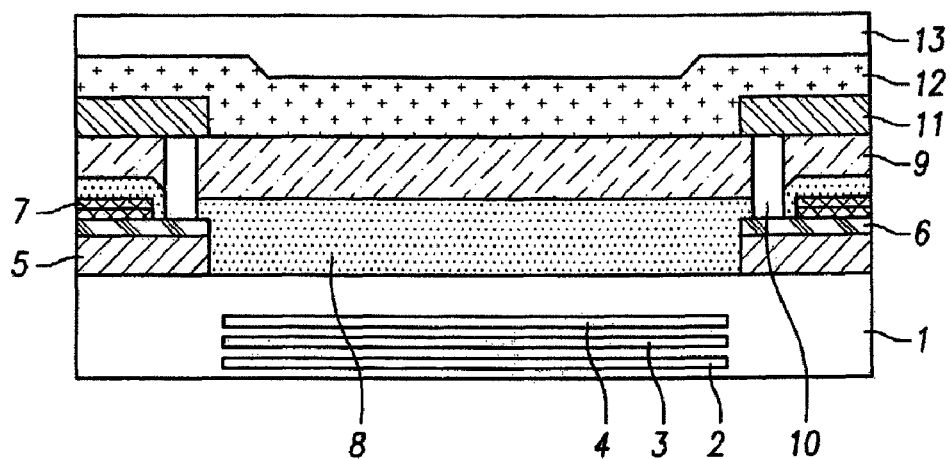
Figure 2C:
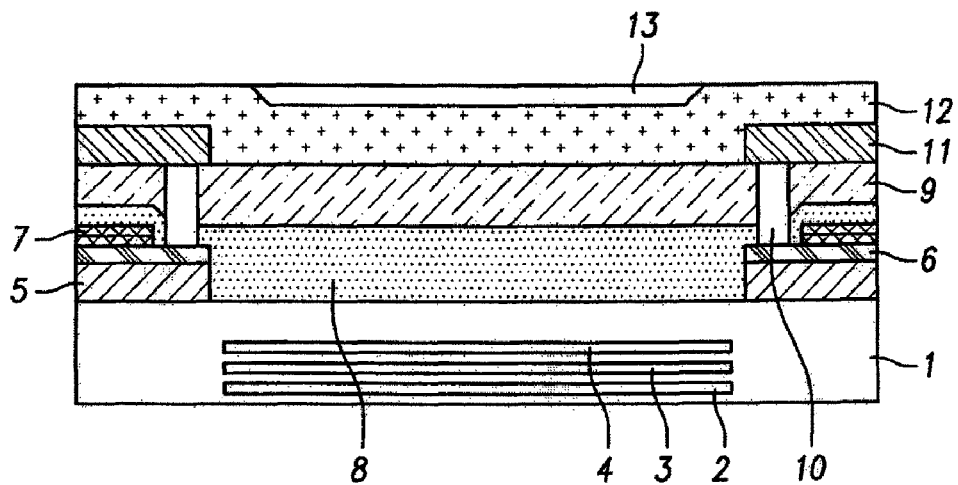

First, as shown in example FIG. 2A, a silicon epi layer 1 is laminated over a semiconductor substrate. A pixel region including a red-light photodiode 2, a green-light photodiode 3 and a blue-light photodiode 4 are formed in the laminated silicon epi layer 1. In other words, the silicon epi layer 1 including the color diodes 2 to 4 are formed over the semiconductor substrate.

A first metal layer 5 may be formed of Cu or Al. Dielectric layer 6 may be formed of silicon nitride. Layer 7 is a metal insulator metal (MIM) layer. A first inter-metal dielectric (IMD) layer 8 may be formed of silicon oxide and a second IMD layer 9 may be formed of undoped silicate glass (USG) or tetra ethyl ortho silicate (TEOS). A contact via 10 and a second metal layer 11, used for electrical connections and signal processing, may be formed over the pixel region. In addition, a first passivation layer 12 formed of USG may be formed over the semiconductor substrate. Thus, a plurality of lower layers 1 to 11 for manufacturing the image sensor are formed over the semiconductor substrate. The first passivation layer 12 is then formed over the lower layers in order to protect the sensor including the lower layers 1 to 11.

The first passivation layer 12 is used to protect the image sensor against external physical impacts and water. When the USG is coated as the first passivation layer 12 to form a protective film for the device, the USG in a pixel region may have a thickness lower than that of the USG in a peripheral region. To prevent this problem, as shown in example FIG. 2B, a spin-on-glass (SOG) formed of a liquid material is coated over the first passivation layer 12 formed of USG to form a SOG layer 13. In other words, since the first passivation layer 12 is formed in the pixel region and the peripheral region with different thicknesses, the SOG layer is formed over the first passivation layer 12 to bury a lower portion. The SOG layer 12 is formed to bury the lower portion of the pixel region such that the pixel region and the peripheral region are planarized.

An annealing process may be performed to cure the SOG layer 13. The entire surface of the semiconductor substrate may be planarized by a chemical-mechanical polishing (CMP) process, as shown in example FIG. 2C. That is, the SOG layer 13 may be removed by the CMP process until the USG of the peripheral region is exposed. Accordingly, it is possible to reduce a difference in thickness between a center of the substrate and an edge after array etching.

Figure 2D:
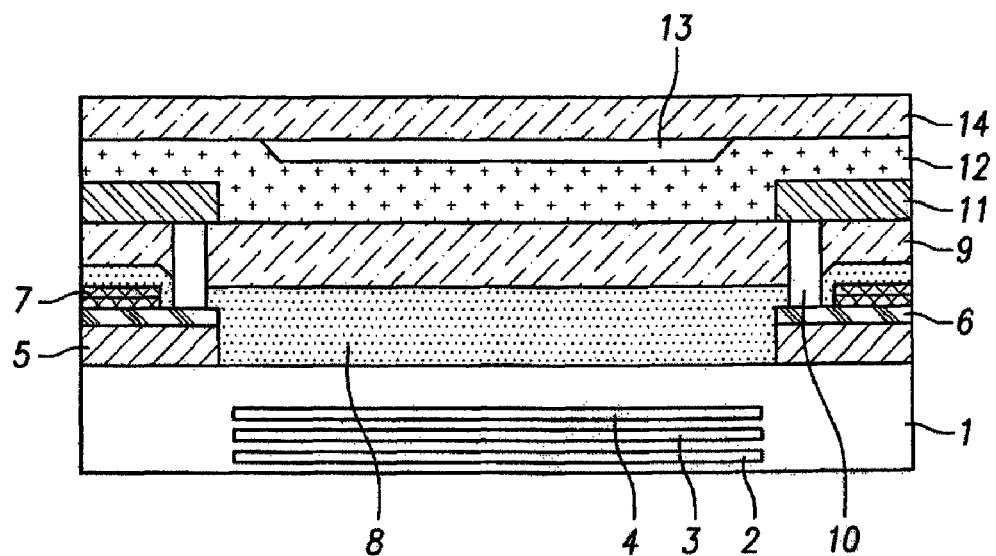

As shown in example FIG. 2D, a second passivation layer 14 of silicon nitride (SiN) may be formed over the SOG layer 13. The uniformity of the thickness may be obtained by the above-described processes. Array etching may be used to form a space in which a plurality of micro lenses 16 are formed, above the photodiodes 2, 3 and 4. In other words, the array etching may be used to reduce a distance between the photodiodes 2, 3 and 4 and the micro lenses 16.

Figure 2E:
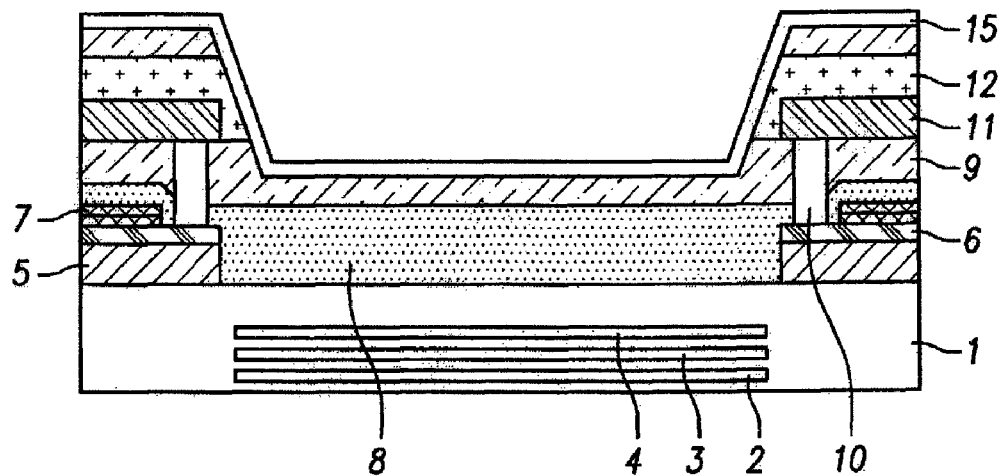

Since a uniform thickness may be achieved by the above-described processes, as shown in example FIG. 2E, it is possible to easily adjust the uniformity of the whole thickness of the substrate, which is generated in the array etching process, and the thickness and the radius of curvature of the micro lens. The array etching process may be performed up to a predetermined depth of the second IMD layer 9 to form a concave area, over which the plurality of micro lenses 16 are provided above the photodiodes 2, 3 and 4, in the substrate. A silicon nitride layer 15 may be formed over the substrate including the concave area.

Figure 2F:
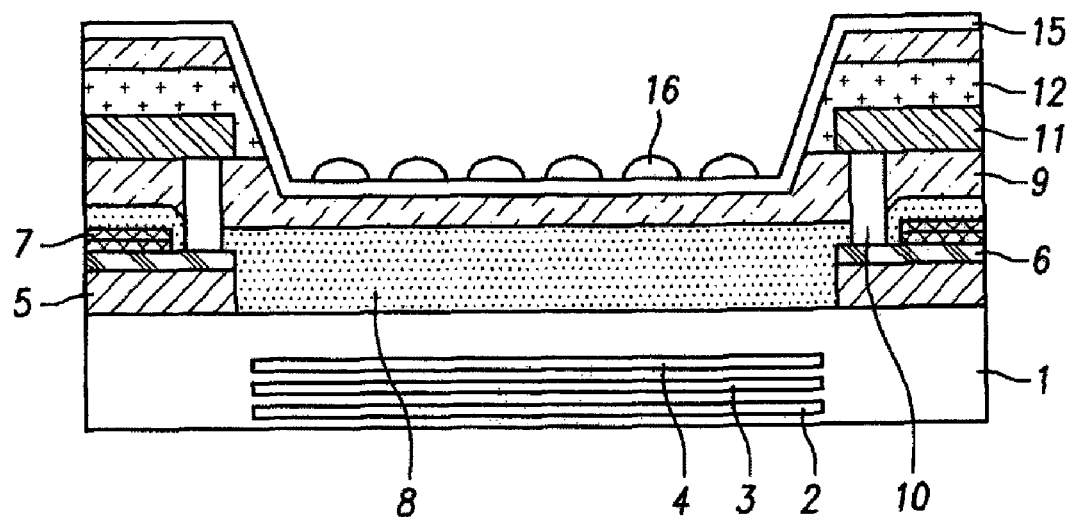

After the nitride layer 15 is formed, as shown in example FIG. 2F, the plurality of micro lenses 16 may be formed over the nitride layer 15 and above the photodiodes 2, 3 and 4. According to embodiments, it is possible to solve a problem which occurs in the subsequent process due to a difference in thickness of the first passivation layer 12 between the pixel region and the peripheral region of the CMOS image sensor due to over CMP. It is thus possible to easily adjust the uniformity of the whole thickness of the semiconductor substrate, and the size and the radius of curvature of the micro lens of the pixel region.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a plurality of lower layers on a semiconductor substrate, the plurality of lower layers including:
      a silicon epi layer including color diodes on the semiconductor substrate, and
      a silicon nitride dielectric layer, a metal insulator metal layer, and first and second inter-metal dielectric layers on the silicon epi layer;
   a first passivation layer on the lower layers in order to protect the lower layers, the first passivation layer being formed in a pixel region and a peripheral region with different thicknesses;
   a spin-on-glass layer over the first passivation layer;
   a second passivation layer over the spin-on-glass layer;
   a concave area in the semiconductor substrate; and
   a plurality of micro lenses on the bottom surface of the concave area.

2. The apparatus of claim 1 configured to form the first inter-metal dielectric layer of a silicon oxide.

3. The apparatus of claim 1, configured to form the second inter-metal dielectric layer of undoped silicate glass.

4. The apparatus of claim 1 configured to form the second inter-metal dielectric layer of tetra ethyl ortho silicate.

5. The apparatus of claim 1 configured to form the first passivation layer of undoped silicate glass.

6. The apparatus of claim 1 configured to form the second passivation layer of silicon nitride.

7. The apparatus of claim 1 configured to form a silicon nitride layer on the semiconductor substrate including the concave area.

8. The apparatus of claim 1 configured to form the spin-on-glass layer by being configured to:
   form the spin-on-glass layer on the first passivation layer;
   anneal the spin-on-glass layer to cure the spin-on-glass layer; and
   perform a chemical mechanical polishing process on the spin-on-glass layer.

9. The apparatus of claim 1 configured to manufacture a CMOS image sensor.

* * * * *